US009658671B2

(12) United States Patent
Tiwari et al.

(10) Patent No.: US 9,658,671 B2
(45) Date of Patent: May 23, 2017

(54) POWER-AWARE CPU POWER GRID DESIGN

(71) Applicant: QUALCOMM Incorporated, San Diego, CA (US)

(72) Inventors: Harshit Tiwari, Hyderabad (IN); Akshay Kumar Gupta, Bangalore (IN); Srinivas Turaga, Bangalore (IN); Deva Sudhir Kumar Pulivendula, Hyderabad (IN); Venkata Devarasetty, Hyderabad (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/173,004

(22) Filed: Jun. 3, 2016

(65) Prior Publication Data

US 2017/0090539 A1    Mar. 30, 2017

(51) Int. Cl.
G11C 5/14       (2006.01)
G06F 1/26       (2006.01)
G06F 12/0811    (2016.01)

(52) U.S. Cl.
CPC .......... *G06F 1/266* (2013.01); *G06F 12/0811* (2013.01); *G11C 5/14* (2013.01); *G06F 2212/60* (2013.01); *G06F 2212/62* (2013.01); *G06F 2213/0038* (2013.01)

(58) Field of Classification Search
CPC ....... G11C 5/147; G11C 5/14; G11C 11/1697; G11C 11/2297
USPC ....................................... 365/226
See application file for complete search history.

(56) References Cited

U.S. PATENT DOCUMENTS

| 6,792,551 | B2 | 9/2004 | Dai et al. |
| 6,976,181 | B2 | 12/2005 | Dai et al. |
| 7,028,196 | B2 | 4/2006 | Soltis et al. |
| 8,335,122 | B2 | 12/2012 | Dreslinski, Jr. et al. |
| 8,977,817 | B2 | 3/2015 | Biswas et al. |
| 2014/0359044 | A1 | 12/2014 | Davis et al. |
| 2016/0182398 | A1* | 6/2016 | Davis .................. G06F 12/0811 710/313 |

FOREIGN PATENT DOCUMENTS

GB    2457171 A    8/2009

OTHER PUBLICATIONS

International Search Report and Written Opinion—PCT/US2016/051470—ISA/EPO—Nov. 18, 2016.

* cited by examiner

*Primary Examiner* — Huan Hoang
(74) *Attorney, Agent, or Firm* — Arent Fox, LLP

(57) ABSTRACT

A method and an apparatus for providing a power grid are provided. The apparatus includes a plurality of memory units comprising at least one SoC memory and at least one cache memory. The apparatus includes a first subsystem coupled to the at least one SoC memory associated with a first power domain. The apparatus further includes a second subsystem coupled to the at least one cache memory associated with a second power domain. The second subsystem may be a CPU subsystem. Because the first power domain sources power from a shared power source, the first power domain may operate at a voltage level that is higher than the operation of memory circuits requires. By moving the at least one cache memory from the first power domain to the second power domain, LDO efficiency loss for components in the first power domain may be reduced.

27 Claims, 5 Drawing Sheets

POWER-AWARE CPU POWER GRID DESIGN

CROSS-REFERENCE TO RELATED APPLICATION

This application claims the benefit of Indian Patent Application No. 5180/CHE/2015, entitled "POWER-AWARE CPU POWER GRID DESIGN" and filed on Sep. 28, 2015, which is expressly incorporated by reference herein in its entirety.

BACKGROUND

Field

The present disclosure relates generally to the design of integrated circuits, and more particularly, to power grid design for the central processing unit (CPU) subsystem.

Background

Semi-conductor apparatuses, such as integrated circuits, are constructed from electronic components formed on semiconductor materials and interconnected with circuit wiring. A network of these circuit wirings may connect a group of components and provide the components with power at a particular voltage level. Power grid (power distribution network) generally refers to the networks of circuit wirings which connect power supply to each component. Power grid design includes the analysis and design of such networks.

An integrated circuit (IC) may have more than one group of components, where each group of components is designed to operate at a different voltage level. For example, a first group of components may be designed to operate at a first voltage level, and a second group of components may be designed to operate at a second, different voltage level. Integrated circuits that are designed with groups of components operating at more than one voltage level are said to have multiple power domains, where each power domain is associated with a particular voltage level. In operation, a particular power domain may be selectively powered up or down by controlling power to the network of circuit wirings connecting the group of components in that power domain.

Because memory circuits and logic circuits have different voltage requirements, memory circuits and logic circuits usually reside in different power domains. CPU cache memory is one type of memory circuit. Thus, CPU cache memory resides in the memory power domain with other types of memory circuits. The memory power domain generally sources its power from a power supplier that is shared by several other components that may have higher voltage requirement than the CPU cache memory. In order to support those other components, the shared power supplier needs to maintain a higher voltage level than the CPU cache memory requires. This leads to significant power inefficiency for CPU cache memory.

SUMMARY

In an aspect of the disclosure, a method and an apparatus for providing a power grid are provided. The apparatus includes a plurality of memory units comprising at least one system on a chip (SoC) memory and at least one cache memory. The apparatus includes a first subsystem coupled to the at least one SoC memory. The at least one SoC memory may be associated with a first power domain. The apparatus includes a second subsystem coupled to the at least one cache memory. The at least one cache memory may be associated with a second power domain.

In another aspect of the disclosure, an apparatus may provide a first power domain to at least one SoC memory. The at least one SoC memory may be coupled to a first subsystem. The apparatus may further provide a second power domain to at least one cache memory. The at least one cache memory may be coupled to a second subsystem.

DETAILED DESCRIPTION

Figure 1:
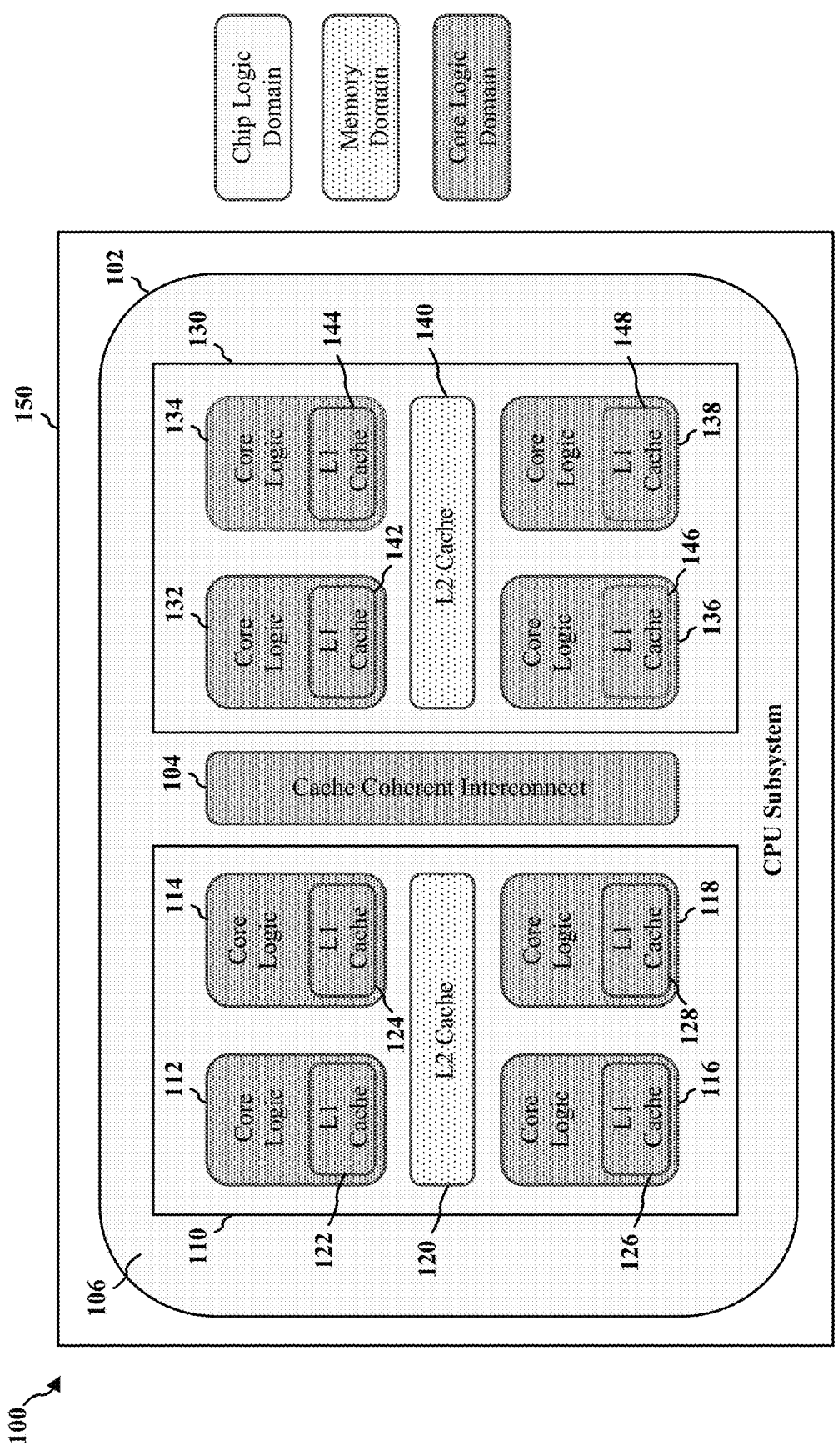
FIG. 1 is a diagram illustrating an example of power grid design for an integrated circuit.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of power grid design will now be presented with reference to various apparatus and methods. These apparatus and methods will be described in the following detailed description and illustrated in the accompanying drawings by various blocks, components, circuits, steps, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more exemplary embodiments, the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), compact disk ROM (CD-ROM) or other optical disk storage, magnetic disk storage or other magnetic storage devices, combinations of the aforementioned types of computer-readable media, or any other medium that can be used to store computer executable code in the form of instructions or data structures that can be accessed by a computer.

A subsystem is a unit or device that is part of a larger system. A subsystem in this disclosure refers to one or more hardware components. A CPU is the electronic circuitry within a computer that carries out the instructions of a computer program by performing the basic arithmetic, logical, control and input/output (I/O) operations specified by the instructions. Most modern CPUs are contained on a single IC chip. An IC that contains a CPU may also contain memory, peripheral interfaces, and other components of a computer; such integrated devices are variously called microcontrollers or systems on a chip (SoC). Some computers employ a multi-core processor, which is a single chip containing two or more CPUs called "cores".

A CPU subsystem is a group of electronic components that perform CPU functionalities. A CPU subsystem may include multiple cores and cache memory circuits. FIG. 1 is a diagram 100 illustrating an example of power grid design for an integrated circuit 150. In one configuration, the IC 150 may be a SoC. The IC 150 includes a CPU subsystem 102. In addition to the CPU subsystem 102, the IC 150 may include additional subsystems (not shown) such as GPU subsystem, I/O subsystem, etc.

As shown, the CPU subsystem 102 includes two quad-core clusters 110, 130, and Cache Coherent Interconnect (CCI) 104. The quad-core cluster 110 includes four core logic circuits 112, 114, 116, 118, and level-two (L2) cache memory 120. The quad-core cluster 130 includes four core logic circuits 132, 134, 136, 138, and L2 cache memory 140. Each of the core logic circuits 112, 114, 116, 118, 132, 134, 136, and 138 is coupled to level-one (L1) cache memory 122, 124, 126, 128, 142, 144, 146, and 148, respectively.

CPU cache memory is small memory on or close to the CPU core. CPU cache memory can operate faster than the much larger main memory. There may be multiple levels of cache memories. L1 cache memory is the fastest cache memory and is closely coupled to the core logic circuit. L2 cache memory is the next fastest cache memory and is only checked when a check on its lower level L1 cache memory misses. For instance, the L2 cache 120 is only checked when a check on L1 cache memory 122, 124, 126, or 128 misses. Similarly, the L2 cache 140 is only checked when a check on L1 cache memory 142, 144, 146, or 148 misses.

Each of the core logic circuits 112, 114, 116, 118, 132, 134, 136, and 138 performs operations for its respective core, and checks its respective L1 and L2 caches for data access. For example, the core logic circuit 112 may check L1 cache 122 first for a particular data. If the check on L1 cache 122 misses, the core logic circuit 112 may check L2 cache 120 for that particular data.

One data may have multiple copies in different cache memories. The CCI 104 manages conflicts and maintains consistency between cache memories of the quad-core clusters 110 and 130. The CCI 104 may synchronize the data stored in cache memories of the quad-core cluster 110 and the data stored in cache memories of the quad-core cluster 130.

In one configuration, the CPU subsystem 102 may place components into three power domains: chip logic domain (e.g., the chip logic domain 208 described below with reference to FIG. 2), memory domain (e.g., the memory domain 212 described below with reference to FIG. 2), and core logic domain (e.g., the core logic domain 210 described below with reference to FIG. 2). These three power domains are illustrated in FIG. 1 with different background patterns. For example, the core logic circuits (112, 114, 116, 118, 132, 134, 136, and 138), the L1 cache memories (122, 124, 126, 128, 142, 144, 146, and 148), and the CCI 104 are grouped into the core logic domain. The L2 cache memories 120 and 140 are grouped into the memory domain. Other components (e.g., CPU wrapper 106) of the CPU subsystem 102 are grouped into the chip logic domain. In one configuration, a SoC memory associated with an additional subsystem on the IC 150 may be placed into the memory domain. In such configuration, the logic circuits of the additional subsystem may be placed into the chip logic domain.

Electronic components in the same power domain usually operate at the same voltage level and are provided with the same voltage level of power. In one configuration, memory circuits (e.g., L1 and L2 cache memories) and logic circuits (e.g., core logic circuits) operate at different voltage levels. Thus, memory circuits and logic circuits may reside in different power domains. For example, L2 cache memories reside in the memory domain and core logic circuits reside in the core logic domain.

In one configuration, instead of residing in the memory domain, L1 cache memories reside in the core logic domain. In such configuration, L1 cache memories (e.g., 122, 124, 126, 128, 142, 144, 146, and 148) and core logic circuits (e.g., 112, 114, 116, 118, 132, 134, 136, and 138) are placed in the same power domain (i.e., core logic domain) in order to meet the CPU timing requirement.

Figure 2:
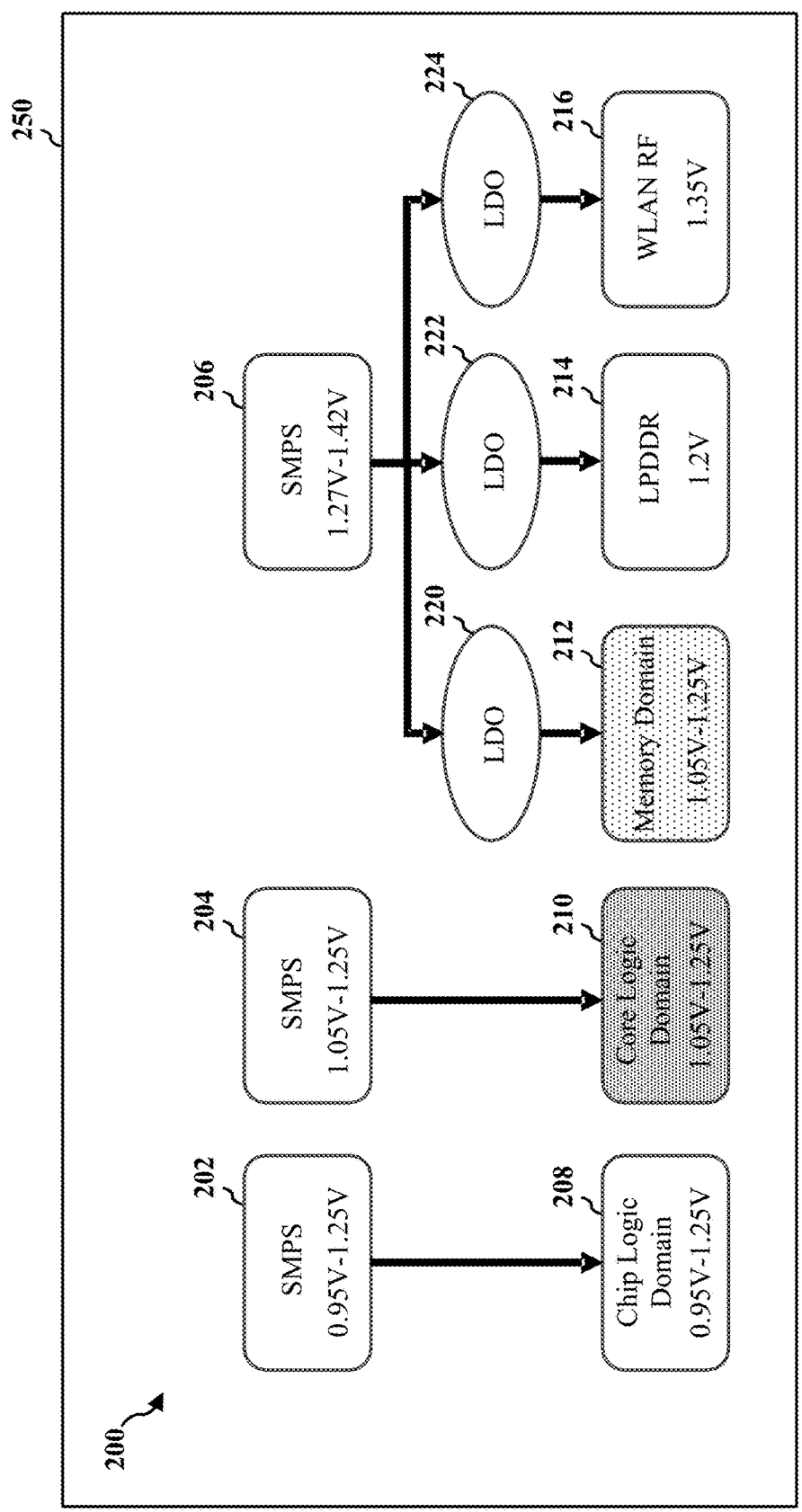
FIG. 2 is a diagram illustrating an example of a power grid of an integrated circuit.

FIG. 2 is a diagram illustrating an example of a power grid 200 of an integrated circuit 250. In one configuration, this IC 250 may be a SoC and this example may show a subset of the SoC power grid. As shown in this example, the power grid 200 includes three power sources, switched-mode power supplies (SMPS) 202, 204, and 206, that provide power to components in three power domains (chip logic domain 208, core logic domain 210, and memory domain 212), a low-power double data rate synchronous DRAM (LPDDR) 214, and a wireless local area network (WLAN) radio frequency (RF) component 216. The SMPS 202, 204, and 206 may be part of power management integrated circuits (PMIC) for managing power requirements of the host system.

The chip logic domain 208 may include components in the CPU subsystem 102 that are not core logic circuits, cache memory, or CCI. The chip logic domain 208 may include logic circuits outside of the CPU subsystem 102, e.g., logic circuits in another subsystem such as I/O subsystem, graphics processing unit (GPU) subsystem, etc. In one configuration, components in the chip logic domain 208 operate at voltage levels ranging from 0.95V to 1.25V. A dedicated power source, SMPS 202, supplies power to components in the chip logic domain 208. In one configuration, the SMPS 202 may provide power to components in the chip logic domain 208 at voltage level ranging from 0.95V to 1.25V.

The core logic domain 210 may include core logic circuits (e.g., 112, 114, 116, 118, 132, 134, 136, and 138), L1 cache memories (e.g., 122, 124, 126, 128, 142, 144, 146, and 148), and CCI (e.g., 104) in the CPU subsystem 102. In one configuration, components in the core logic domain 210 operate at voltage levels ranging from 1.05V to 1.25V. The core logic circuits may operate at voltage level as low as 0.95V. Because the L1 cache memories reside in the core logic domain 210 and the L1 cache memories may require a minimum voltage of 1.05V to operate, the minimum voltage of the core logic domain may be set at 1.05V. A dedicated power source, SMPS 204, supplies power to components in the core logic domain 210. In one configuration, the SMPS 204 may provide power to components in the core logic domain 210 at voltage level ranging from 1.05V to 1.25V.

Having dedicated power source for the chip logic domain 208 and the core logic domain 210 allows seamless voltage scaling based on performance requirements. Dynamic voltage scaling to decrease voltage may be done in order to conserve power; and dynamic scaling to increase voltage may be done in order to increase system performance, or to increase reliability. For example, having dedicated power source (i.e., SMPS 204) for the core logic domain 210 allows dynamic voltage scaling on components in the core logic domain 210 based on CPU performance requirements. The voltage supplied to all components in the core logic domain 210 may be decreased, e.g., to 1.05V, to conserve power; or may be increased, e.g., to 1.25V, to increase the performance of the CPU subsystem 102.

The memory domain 212 may include L2 cache memories (e.g., 120 and 140) and other SoC memories. In one configuration, the other SoC memories may be an on-chip static random-access memory (SRAM) outside of the CPU subsystem. In one configuration, the other SoC memories may be one or more of modem DSP L2 cache, audio DSP L2 cache, graphics internal (SoC) RAM, display internal (SoC) RAM, camera internal (SoC) RAM, video internal (SoC) RAM, peripherals (e.g., USB, Crypto, eMMC) internal (SoC) RAM, shared memory, etc. In one configuration, those other SoC memories may be coupled to components outside of the CPU subsystem 102 (e.g., coupled to another subsystem such as I/O subsystem, GPU subsystem, etc.). In one configuration, components in the memory domain 212 operate at voltage levels ranging from 1.05V to 1.25V. Because memories may require a minimum voltage of 1.05V to operate, the minimum voltage of the core logic domain may be set at 1.05V.

A shared power source, SMPS 206, supplies power to components in the memory domain 212. In one configuration, components in the memory domain 212 may be sub-regulated via a low-dropout (LDO) regulator 220 sourced from SMPS 206. Many other components of the IC 250 may be sub-regulated via other LDO regulators sourced from SMPS 206. For example, LPDDR 214 may be sub-regulated via LDO regulator 222 sourced from SMPS 206, and WLAN RF component 216 may be sub-regulated via LDO regulator 224 sourced from SMPS 206.

Each of the LDO regulators 220, 222, and 224 has a voltage requirement in order to ensure proper operation of the components to which it supplies power. For example, because memories in the memory domain 212 may require a minimum voltage of 1.05V to operate, the voltage requirement of the LDO regulator 220 may be 1.05V. Similarly, because LPDDR 214 may require a voltage of 1.2V to operator, the voltage requirement of the LDO regulator 222 may be 1.2V. Because WLAN RF component 216 may require a voltage of 1.35V to operator, the voltage requirement of the LDO regulator 224 may be 1.35V.

SMPS 206 may set its voltage to the highest voltage required amongst the LDO regulators 220, 222, and 224 in order to ensure all components the LDO regulators 220, 222, and 224 provide power to can operate properly. In one configuration, the LDO regulators 220, 222, and 224 may need at least 62.5 mV headroom for reliable voltage regulation. Because LPDDR 214 is always on, the voltage output of SMPS 206 may be greater than or equal to 1.27V, which is the sum of the voltage requirement of LDO regulator 222 (1.2V) and the 62.5 mV headroom. In one configuration, the SMPS 206 may provide power at voltage level ranging from 1.27V to 1.42V. Because the memories in the memory domain 212 can operate at voltage as low as 1.05V, there may be significant LDO efficiency loss for the memories in the memory domain 212 (e.g., L2 cache memories 120 and 140).

Figure 3:
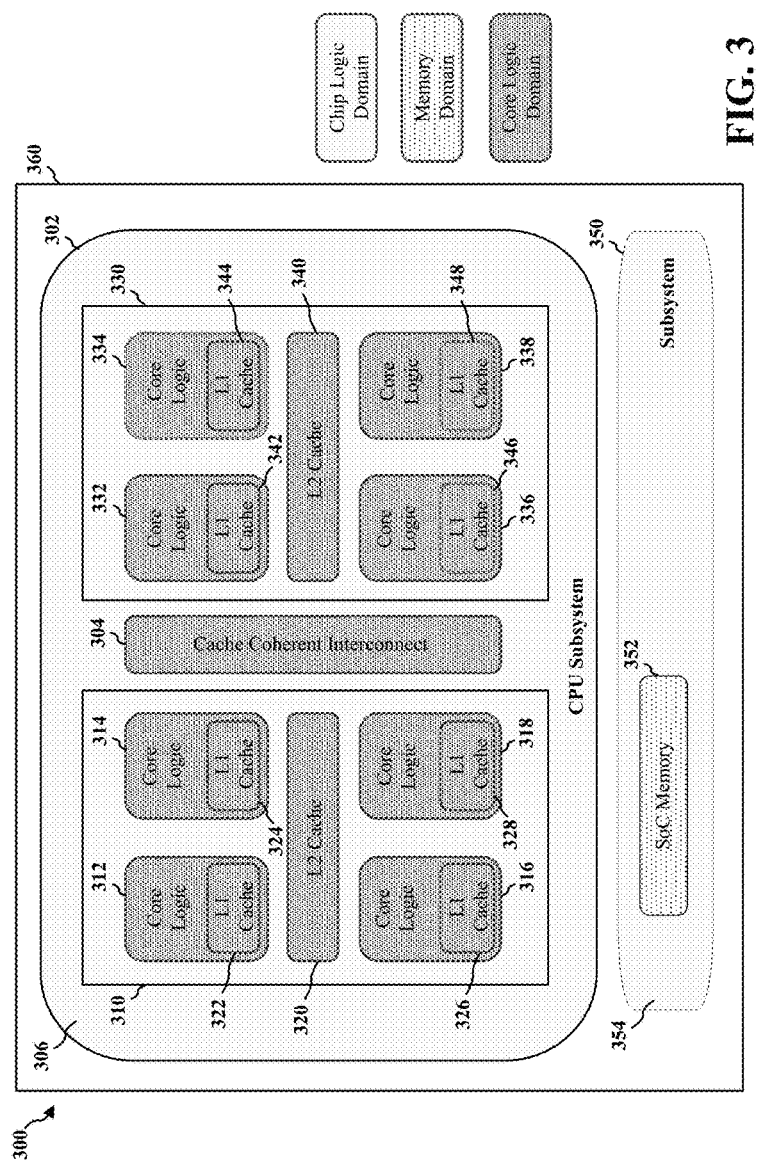
FIG. 3 is a diagram illustrating an example of power grid design for an integrated circuit.

FIG. 3 is a diagram 300 illustrating an example of power grid design for an integrated circuit 360. The IC 360 includes a CPU subsystem 302 and an additional subsystem 350. In one configuration, the IC 360 may be a SoC. The subsystem 350 may be a GPU subsystem, an I/O subsystem, or any subsystem other than the CPU subsystem 302. As shown, the CPU subsystem 302 includes two quad-core clusters 310, 330, and CCI 304. The quad-core cluster 310 includes four core logic circuits 312, 314, 316, 318, and L2 cache memory 320. The quad-core cluster 330 includes four core logic circuits 332, 334, 336, 338, and L2 cache memory 340. Each of the core logic circuits 312, 314, 316, 318, 332, 334, 336, and 338 is coupled to L1 cache memory 322, 324, 326, 328, 342, 344, 346, and 348, respectively.

The subsystem 350 includes a SoC memory 352. In one configuration, the SoC memory 352 may be an on-chip SRAM outside of the CPU subsystem 302. In one configuration, the SoC memory 352 may be one or more of modem DSP L2 cache, audio DSP L2 cache, graphics internal (SoC) RAM, display internal (SoC) RAM, camera internal (SoC) RAM, video internal (SoC) RAM, peripherals (e.g., USB, Crypto, eMMC) internal (SoC) RAM, shared memory, etc. In one configuration, the SoC memory 352 may be part of the subsystem 350. In another configuration, the SoC memory 352 may be outside the subsystem 350 but coupled to or associated with components (e.g., logic circuits 354) of the subsystem 350.

Each of the core logic circuits 312, 314, 316, 318, 332, 334, 336, and 338 performs operations for its respective core, and checks its respective L1 and L2 caches for data access. For example, the core logic circuit 312 may check L1 cache 322 first for a particular data. If the check on L1 cache 322 misses, the core logic circuit 322 may check L2 cache 320 for that particular data.

One data may have multiple copies in different cache memories. The CCI 304 manages conflicts and maintains consistency between cache memories of the quad-core clusters 310 and 330. The CCI 304 may synchronize the data stored in cache memories of the quad-core cluster 310 and the data stored in cache memories of the quad-core cluster 330.

In one configuration, the CPU subsystem 302 and the subsystem 350 may place components into three power domains: chip logic domain (e.g., the chip logic domain 208 described above with reference to FIG. 2), memory domain (e.g., the memory domain 212 described above with reference to FIG. 2), and core logic domain (e.g., the core logic domain 210 described above with reference to FIG. 2). These three power domains are illustrated in FIG. 3 with different background patterns. For example, the core logic circuits (312, 314, 316, 318, 332, 334, 336, and 338), the L1 cache memories (322, 324, 326, 328, 342, 344, 346, and 348), the L2 cache memories (320 and 340), and the CCI 304 are grouped into the core logic domain. The SoC memory 352 is placed into the memory domain. Other components of the CPU subsystem 302 and the subsystem 350 (e.g., CPU wrapper 306 of the CPU subsystem 302, logic circuits 354 of the subsystem 350) are grouped into the chip logic domain.

Comparing to the power grid design described above in FIG. 1, L2 cache memories 320 and 340 are migrated from the memory domain to the core logic domain. This imposes no additional voltage constraints on the core logic domain as L1 cache memories (e.g., 322, 324, 326, 328, 342, 344, 346, and 348) are already in the core logic domain and L2 cache memory has similar voltage requirements as L1 cache memory.

Moving L2 cache memory from the memory domain to the core logic domain enables a single voltage/power domain for all CPU logic and memory and provides a better power distribution network. Moving L2 cache memory from the memory domain to the core logic domain also allows the core logic domain to be a "true voltage island" independent of the rest of the IC 360. Therefore, moving L2 cache memory from the memory domain to the core logic domain may allow better voltage isolation for the core logic domain.

In one configuration, because the L2 cache memories 320 and 340 are moved from the memory domain to the core logic domain, the L2 cache memories 320 and 340 source power from the SMPS 204 instead of from the SMPS 206. As described above with reference to FIG. 2, the SMPS 204 provides power at voltage level ranging from 1.05V to 1.25V, and the SMPS 206 provides power at voltage level ranging from 1.27V to 1.42V. Thus, the SMPS 204 provides power with lower voltage than the SMPS 206 does. Therefore, by sourcing power from SMPS 204 instead of SMPS 206, the L2 cache memories 320 and 340 reduce power consumption at battery due to lower voltage of SMPS 204 compared to SMPS 206. There may be less LDO efficiency loss for the cache memories 320 and 340 by switching the L2 cache memories 320 and 340 from the memory domain to the core logic domain.

Moving L2 cache memory from the memory domain to the core logic domain removes dependency between the core logic domain operating modes and memory domain voltage. Power voltage provided to memory circuits (e.g., components in the memory domain) may be greater than or equal to power voltage provided to logic circuits (e.g., components in the core logic domain and chip logic domain). When voltage of either of the core logic domain or the chip logic domain is pulled higher, voltage of the memory domain is also pulled high. That causes greater LDO efficiency loss for L2 cache memory if L2 cache memory is placed in the memory domain. By moving L2 cache memory from the memory domain to the core logic domain, pulling higher the voltage of the chip logic domain may not cause greater LDO efficiency loss for L2 cache memory, thus may save power at the battery.

Moving L2 cache memory from the memory domain to the core logic domain may improve memory domain LDO (e.g., LDO regulator 220) headroom due to lower peak current requirement. Lower LDO headroom requirement also leads to power savings.

When the CPU subsystem 302 enters into low-power mode, all the cores may be turned off. SMPS 204 may remain on to provide power to the L1 and L2 cache memories. The output voltage of SMPS 204 may be reduced to a retention voltage that is just enough to retain the content in the cache memories. In comparison, if L2 cache resides in the memory domain, the output voltage of SMPS 206 cannot be reduced due to other dependencies (e.g., LPDDR 214). Therefore, moving L2 cache memory from the memory domain to the core logic domain introduces power savings.

Because L2 cache memory is moved to the core logic domain, level shifters are between the core logic domain and L2 cache memory may be removed. Removing level shifters may lead to smaller die area. Because level shifters adds delay and make it harder to achieve maximum frequency, removing level shifters may also improve timing constraints for achieving maximum frequency. In one configuration, moving L2 cache memory from the memory domain to the core logic domain may lead to 20% reduction in the power consumption of L2 cache memory.

Figure 4:
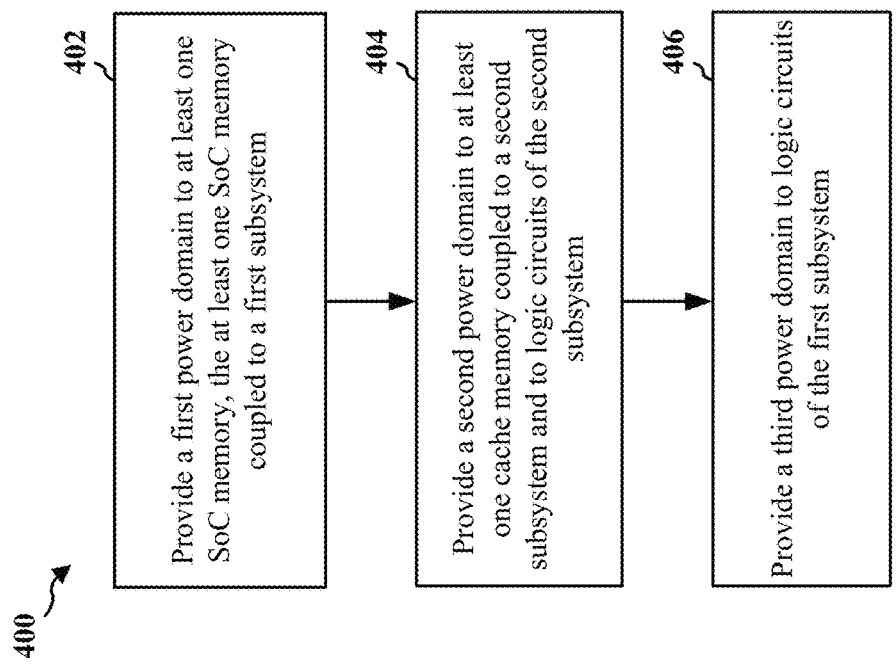
FIG. 4 is a flowchart of a method of providing a power grid.

FIG. 4 is a flowchart 400 of a method of providing a power grid. The method may be performed by an IC (e.g., the IC 150, 250, or 360). In one configuration, the IC performing this method may be a SoC. At 402, the SoC provides a first power domain to at least one SoC memory. The at least one SoC memory is coupled to a first subsystem of the SoC. In one configuration, the first power domain may be the memory domain (e.g., the memory domain 212 or 510). In one configuration, the first subsystem may be the subsystem 350 in FIG. 3 or the subsystem 550 in FIG. 5. The at least one SoC memory may be the SoC memory 352 in FIG. 3 or the SoC memory 552 in FIG. 5. In another configuration, the first subsystem may be the additional subsystem and the at least one SoC memory may be the memory associated with the additional subsystem described above with reference to FIG. 1.

In one configuration, the first power domain sources power from a shared power source (e.g., SMPS 206 or 508). In such configuration, the shared power source may be further configured to supply power to at least one of an LPDDR (e.g., the LPDDR 214) or a WLAN RF component (e.g., the WLAN RF component 216).

At 404, the SoC provides a second power domain to at least one cache memory coupled to a second subsystem and to logic circuits of the second subsystem. In one configuration, the second power domain may be the core logic domain (e.g., the core logic domain 210 or 506). In one configuration, the second subsystem may be the CPU subsystem 302 in FIG. 3 or the CPU subsystem 530 in FIG. 5. In such configuration, the at least one cache memory coupled to the second subsystem may be the L2 cache memories and/or the L1 cache memories described with reference to FIG. 3 or FIG. 5, and the logic circuits of the second subsystem may be the core logic circuits described with reference to FIG. 3 or FIG. 5. In another configuration, the second subsystem may be the CPU subsystem 102. In such configuration, the at least one cache memory coupled to the second subsystem may be the L1 cache memories described above with reference to FIG. 1, and the logic circuits of the second subsystem may be the core logic circuits (e.g. 112, 114, 116, 118, 132, 134, 136, and 138) described above with reference to FIG. 1.

In one configuration, the second power domain sources power from a dedicated power source (e.g., SMPS 204 or 506). In one configuration, the second power domain may maintain a minimum voltage required for retaining data in the at least one cache memory when the second subsystem enters into a low-power mode.

At 406, the SoC provides a third power domain to logic circuits of the first subsystem. In one configuration, the third power domain may be the chip logic domain (e.g., the chip logic domain 208 or 520). In one configuration, the logic circuits of the first subsystem may be the logic circuits 354 of the subsystem 350 described above with reference to FIG. 3, or the logic circuits 554 of the subsystem 550 described below with reference to FIG. 5. In another configuration, the logic circuits of the first subsystem may be the logic circuits of the additional subsystem described above with reference to FIG. 1. In one configuration, the third power domain sources power from a dedicated power source (e.g., SMPS 202 or 504).

Figure 5:
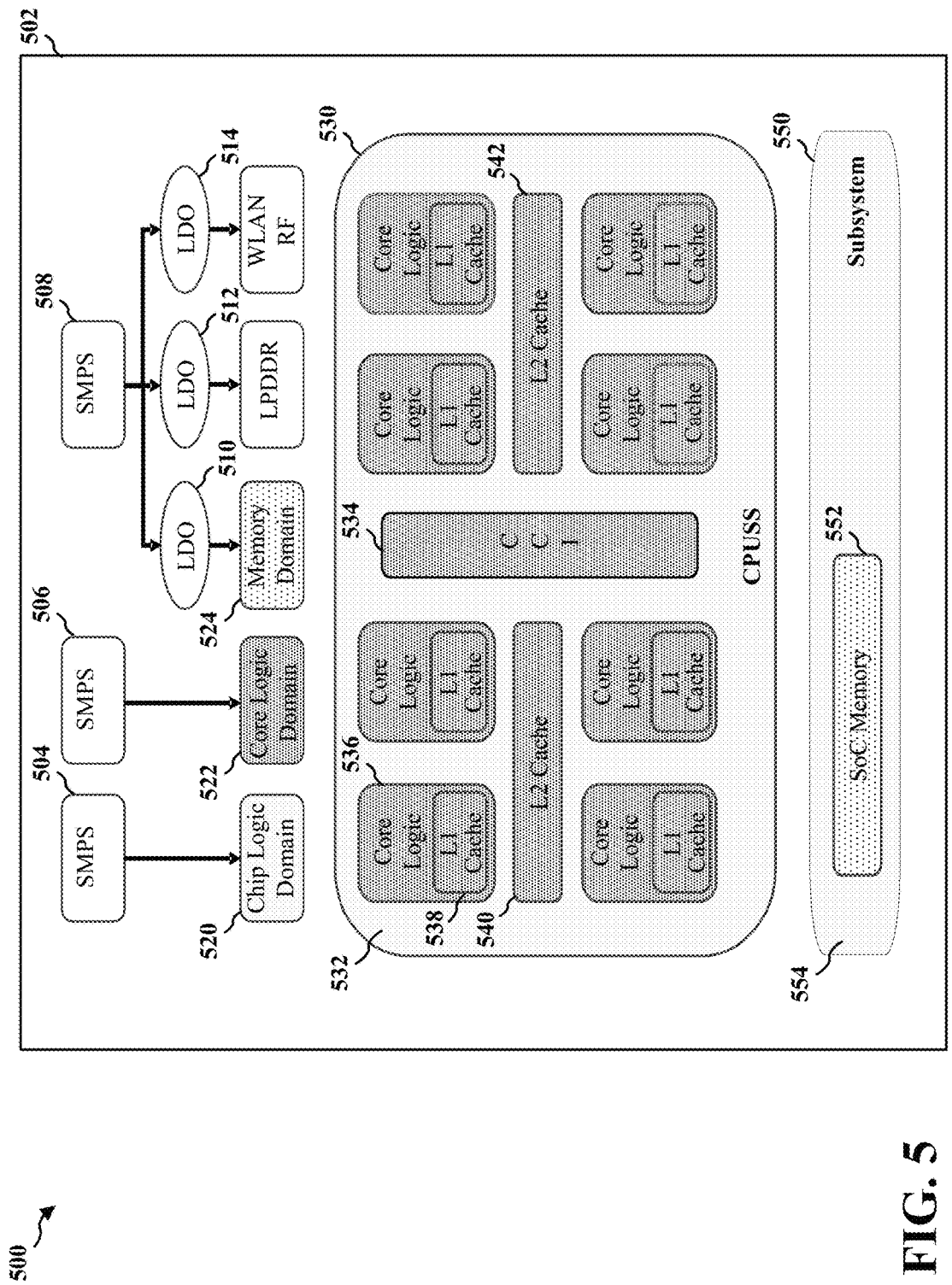
FIG. 5 is a diagram illustrating an integrated circuit configured to implement the method of FIG. 4.

FIG. 5 is a diagram 500 illustrating an integrated circuit 502 configured to implement the method of FIG. 4. In one configuration, each component of the IC 502 performs similar functions to the corresponding component of IC 250 described above with reference to FIG. 2, IC 360 described above with reference to FIG. 3, and IC 150 described above with reference to FIG. 1. In one configuration, the IC 502 is a SoC.

As shown, the IC 502 may include a CPU subsystem 530 and an additional subsystem 550. The subsystem 550 may be a GPU subsystem, an I/O subsystem, or any subsystem other than the CPU subsystem 530. The CPU subsystem 530 includes several core logic circuits (e.g., core logic circuit 536), several L1 cache memories (e.g., L1 cache memory 538), L2 cache memories 540 and 542, and CCI 534. The subsystem 550 includes a SoC memory 552. In one configuration, the SoC memory 552 may be an on-chip SRAM outside of the CPU subsystem 530. In one configuration, the SoC memory 552 may be one or more of modem DSP L2 cache, audio DSP L2 cache, graphics internal (SoC) RAM, display internal (SoC) RAM, camera internal (SoC) RAM, video internal (SoC) RAM, peripherals (e.g., USB, Crypto, eMMC) internal (SoC) RAM, shared memory, etc. In one configuration, the SoC memory 552 may be part of the subsystem 550. In another configuration, the SoC memory 552 may be outside the subsystem 550 but coupled to or associated with components (e.g., logic circuits 554) of the subsystem 550.

The IC 502 includes SMPS 504, 506, and 508 that provide power to components in three power domains (chip logic domain 520, core logic domain 522, and memory domain 524). Three LDO regulators 510, 512, and 514 source power from the SMPS 508. In one configuration, components in the memory domain 524 may be sub-regulated via a LDO regulator 510 sourced from the SMPS 508. Many other components of the IC 502 may be sub-regulated via LDO regulators 512 and 514 sourced from the SMPS 508.

In one configuration, the CPU subsystem 530 and the subsystem 550 may place components into three power domains: chip logic domain 520, memory domain 524, and core logic domain 522. For example, the core logic circuits (e.g., 536), the L1 cache memories (e.g., 538), the L2 cache memories (540 and 542), and the CCI 534 are grouped into the core logic domain 522. The SoC memory 552 is placed into the memory domain 524. Other components of the CPU subsystem 530 and the subsystem 550 (e.g., CPU wrapper 532 of the CPU subsystem 530, logic circuits 554 of the subsystem 550) are grouped into the chip logic domain 520.

The IC 502 may include means for providing a first power domain to at least one SoC memory. The at least one SoC memory is coupled to a first subsystem of the SoC. In one configuration, the first power domain may be the memory domain 524. In one configuration, the first subsystem may be the subsystem 550 and the at least one SoC memory may be the SoC memory 552. In one configuration, the means for providing the first power domain to the at least one SoC memory may be the SMPS 508, the LDO regulator 510, and the circuit wirings that connect the SMPS 508, the LDO regulator 510, and the at least one SoC memory. In one configuration, the means for providing the first power domain performs the operations described above with regard to 402 of FIG. 4.

The IC 502 may include means for providing a second power domain to at least one cache memory coupled to a second subsystem and to logic circuits of the second subsystem. In one configuration, the second power domain may be the core logic domain 522. In one configuration, the second subsystem may be the CPU subsystem 530. In such configuration, the at least one cache memory coupled to the second subsystem may be the L2 cache memories (e.g., 540 and/or 542) and/or the L1 cache memories (e.g., 538), and the logic circuits of the second subsystem may be the core logic circuits (e.g., 536). In one configuration, the means for providing the second power domain to the at least one cache memory coupled to the second subsystem and to the logic circuits of the second subsystem may be the SMPS 506 and the circuit wirings that connect the SMPS 506 to the at least one cache memory and the logic circuits of the second subsystem. In one configuration, the means for providing the second power domain performs the operations described above with regard to 404 of FIG. 4.

The IC 502 may include means for providing a third power domain to logic circuits of the first subsystem. In one configuration, the third power domain may be the chip logic domain 520. In one configuration, the logic circuits of the first subsystem may be the logic circuits 554 of the subsystem 550. In one configuration, the means for providing the third power domain to the logic circuits of the first subsystem may be the SMPS 504 and the circuit wirings that connect the SMPS 504 to the logic circuits of the first subsystem. In such configuration, the means for providing the third power domain performs the operations described above with regard to 406 of FIG. 4.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

What is claimed is:

1. An apparatus, comprising:
a plurality of memory units comprising at least one system on a chip (SoC) memory and at least one cache memory;
a first subsystem coupled to the at least one SoC memory, wherein the at least one SoC memory is a low-power double data rate synchronous DRAM (LPDDR) associated with a first power domain; and
a second subsystem coupled to the at least one cache memory, the at least one cache memory comprising at least one level one (L1) cache memory and at least one level two (L2) cache memory, wherein the at least one L1 cache memory and the at least one L2 cache memory are associated with a second power domain.

2. The apparatus of claim 1, wherein the second subsystem is a central processing unit (CPU) subsystem.

3. The apparatus of claim 2, wherein the CPU subsystem comprises one or more processor clusters, wherein the L2 cache memory is coupled to one of the one or more processor clusters.

4. The apparatus of claim 2, wherein the CPU subsystem comprises a plurality of processors, wherein the L1 cache memory is coupled to one of the plurality of processors.

5. The apparatus of claim 1, wherein the first subsystem comprises a first logic circuit, the first logic circuit associated with a third power domain.

6. The apparatus of claim 5, wherein the second subsystem comprises a second logic circuit, the second logic circuit associated with the second power domain.

7. The apparatus of claim 1, wherein the first subsystem and the second subsystem reside on a SoC.

8. The apparatus of claim 1, further comprising a first power source and a second power source, wherein the first power source is configured to supply power to the first power domain and the second power source is configured to supply power to the second power domain.

9. The apparatus of claim 8, further comprising a wireless local area network (WLAN) radio frequency (RF) component, wherein the first power source is further configured to supply power to the LPDDR or the WLAN RF component.

10. The apparatus of claim 1, wherein the second power domain maintains a minimum voltage required for retaining data in the at least one cache memory when the second subsystem enters into a low-power mode.

11. A method of providing a power grid, comprising:
providing a first power domain to at least one system on a chip (SoC) memory, the at least one SoC memory is a low-power double data rate synchronous DRAM (LPDDR) and is coupled to a first subsystem; and
providing a second power domain to at least one cache memory, the at least one cache memory comprising at least one level one (L1) cache memory and at least one level two (L2) cache memory, the at least one L1 cache memory and the at least one L2 cache memory are coupled to a second subsystem.

12. The method of claim 11, wherein the second subsystem is a central processing unit (CPU) subsystem.

13. The method of claim 12, wherein the CPU subsystem comprises one or more processor clusters, wherein the L2 cache memory is coupled to one of the one or more processor clusters.

14. The method of claim 12, wherein the CPU subsystem comprises a plurality of processors, wherein the L1 cache memory is coupled to one of the plurality of processors.

15. The method of claim 11, wherein the first subsystem comprises a first logic circuit, the method further comprising providing a third power domain to the first logic circuit.

16. The method of claim 15, wherein the second subsystem comprises a second logic circuit, the method further comprising providing the second power domain to the second logic circuit.

17. The method of claim 11, wherein the first subsystem and the second subsystem reside on a SoC.

18. The method of claim 11, wherein a first power source is configured to supply power to the first power domain and a second power source is configured to supply power to the second power domain.

19. The method of claim 18, wherein the first power source is further configured to supply power to the low-power DDR (LPDDR) or a wireless local area network (WLAN) radio frequency (RF) component.

20. An apparatus for providing a power grid, comprising:
means for providing a first power domain to at least one system on a chip (SoC) memory, the at least one SoC memory is a low-power double data rate synchronous DRAM (LPDDR) and is coupled to a first subsystem; and
means for providing a second power domain to at least one cache memory, the at least one cache memory comprising at least one level one (L1) cache memory and at least one level two (L2) cache memory, the at least one L1 cache memory and the at least one L2 cache memory are coupled to a second subsystem.

21. The apparatus of claim 20, wherein the second subsystem is a central processing unit (CPU) subsystem.

22. The apparatus of claim 21, wherein the CPU subsystem comprises one or more processor clusters, wherein the L2 cache memory is coupled to one of the one or more processor clusters.

23. The apparatus of claim 21, wherein the CPU subsystem comprises a plurality of processors, wherein the L1 cache memory is coupled to one of the plurality of processors.

24. The apparatus of claim 20, wherein the first subsystem comprises a first logic circuit, the apparatus further comprising means for providing a third power domain to the first logic circuit.

25. The apparatus of claim 24, wherein the second subsystem comprises a second logic circuit, wherein the means for providing the second power domain to the at least one cache memory is further configured to provide the second power domain to the second logic circuit.

26. The apparatus of claim 20, wherein the first subsystem and the second subsystem reside on a SoC.

27. The apparatus of claim 20, wherein the means for providing the first power domain comprises a first power source configured to supply power to the first power domain, and wherein the means for providing the second power domain comprises a second power source configured to supply power to the second power domain.

* * * * *